US010827650B2

(12) United States Patent
Grassi

(10) Patent No.: US 10,827,650 B2
(45) Date of Patent: Nov. 3, 2020

(54) SUBMARINE OPTICAL REPEATER WITH HIGH VOLTAGE ISOLATION

(71) Applicant: IPG PHOTONICS CORPORATION, Oxford, MA (US)

(72) Inventor: Sergio Walter Grassi, Sesto San Giovanni (IT)

(73) Assignee: IPG PHOTONICS CORPORATION, Oxford, MA (US)

( * ) Notice: Subject to any disclaimer, the term of this patent is extended or adjusted under 35 U.S.C. 154(b) by 0 days.

(21) Appl. No.: 16/377,128

(22) Filed: Apr. 5, 2019

(65) Prior Publication Data

US 2019/0313547 A1 Oct. 10, 2019

Related U.S. Application Data

(60) Provisional application No. 62/653,980, filed on Apr. 6, 2018.

(51) Int. Cl.
*H02G 15/14* (2006.01)
*H05K 7/20* (2006.01)
(Continued)

(52) U.S. Cl.
CPC ......... *H05K 7/2039* (2013.01); *G02B 6/4417* (2013.01); *G02B 6/4427* (2013.01);
(Continued)

(58) Field of Classification Search
CPC .. G02B 6/4427; G02B 6/4428; G02B 6/4429; H02G 15/14
See application file for complete search history.

(56) References Cited

U.S. PATENT DOCUMENTS 3,610,812 A * 10/1971 Furusawa ............... H02G 15/14
174/60
4,508,423 A * 4/1985 Winter ................. G02B 6/4488
228/148
(Continued)

FOREIGN PATENT DOCUMENTS

WO 2005050263 6/2005

OTHER PUBLICATIONS

International Search Report and Written Opinion dated Jul. 1, 2019 in corresponding PCT Application No. PCT/US19/26192.

*Primary Examiner* — Tanya T Motsinger
(74) *Attorney, Agent, or Firm* — Grossman, Tucker, Perreault & Pfleger, PLLC

(57) ABSTRACT

The systems and methods described herein provide a submarine optical repeater in which a plurality of thermally conductive, electrically insulative, ceramic members form a hollow structure having an interior volume that is maintained at a relatively high first voltage when compared to a relatively low second voltage maintained external to the hollow structure. A conductive element at the first voltage disposed in the interior volume provides power to optical repeaters disposed on the interior surface of the hollow structure. Power flows radially outward from the conductive element to the optical repeaters to the surrounding environment about the submarine optical repeater. The thermally conductive ceramic members electrically isolate the optical repeaters from the second voltage while providing a thermally conductive pathway for the heat generated during the operation of the optical repeaters to dissipate into the surrounding environment.

28 Claims, 8 Drawing Sheets

(51) Int. Cl.
  *G02B 6/44* (2006.01)
  *H01B 7/14* (2006.01)
  *H02G 1/10* (2006.01)
  *H04B 10/80* (2013.01)
  *H04B 10/29* (2013.01)
  *H01B 7/42* (2006.01)
  *H04B 10/25* (2013.01)

(52) U.S. Cl.
  CPC ............... *H01B 7/14* (2013.01); *H01B 7/421* (2013.01); *H02G 1/10* (2013.01); *H04B 10/25891* (2020.05); *H04B 10/29* (2013.01); *H04B 10/808* (2013.01)

(56) References Cited

U.S. PATENT DOCUMENTS

| | | | | |
|---|---|---|---|---|
| 4,871,121 A * | 10/1989 | Kodaka | ............... | G02B 6/4427 242/360 |
| 5,659,651 A * | 8/1997 | Watanabe | ............ | G02B 6/4448 174/70 S |
| 5,666,457 A * | 9/1997 | Ogiya | ................. | G02B 6/4448 385/139 |
| 5,857,049 A * | 1/1999 | Beranek | ............... | G02B 6/4225 385/88 |
| 5,887,050 A * | 3/1999 | Fenske | .................. | H04M 3/18 379/4 |
| 6,324,072 B1 * | 11/2001 | Lorenz | ................. | H01L 25/072 257/723 |
| 6,703,561 B1 * | 3/2004 | Rosenberg | .......... | H01S 5/02212 174/541 |
| 7,489,438 B1 * | 2/2009 | Young | ................. | G02B 6/4448 359/333 |
| 8,995,811 B2 * | 3/2015 | Li | ........................ | G02B 6/4427 385/134 |
| 2002/0132576 A1 * | 9/2002 | Sit | ............................ | H04B 1/03 455/7 |
| 2003/0108304 A1 * | 6/2003 | Ziari | .................... | G02B 6/4257 385/92 |
| 2004/0196529 A1 * | 10/2004 | Young | .................. | G02B 6/4428 359/333 |
| 2005/0105164 A1 * | 5/2005 | Young | ................. | H01S 3/06704 359/333 |
| 2005/0179988 A1 * | 8/2005 | Young | .................. | G02B 6/4448 359/333 |
| 2005/0185257 A1 * | 8/2005 | Young | .................. | G02B 6/4428 359/333 |
| 2005/0200943 A1 * | 9/2005 | DeVincentis | ........ | G02B 6/4427 359/333 |
| 2014/0147127 A1 * | 5/2014 | McColloch | .......... | G02B 6/4269 398/135 |
| 2014/0160685 A1 * | 6/2014 | Kim | ..................... | H05K 1/0306 361/720 |
| 2015/0116946 A1 * | 4/2015 | Katase | ................ | H05K 7/2039 361/713 |
| 2017/0071075 A1 * | 3/2017 | Hayakawa | ........... | H05K 5/0278 |
| 2019/0313547 A1 * | 10/2019 | Grassi | ................ | G02B 6/4427 |

* cited by examiner

SUBMARINE OPTICAL REPEATER WITH HIGH VOLTAGE ISOLATION

CROSS-REFERENCE TO RELATED APPLICATIONS

The present application claims the benefit of the filing date of U.S. Provisional Application Ser. No. 62/653,980 filed Apr. 6, 2018, the teachings of which are hereby incorporated herein by reference.

TECHNICAL FIELD

The present disclosure relates to optical repeaters for use in submarine applications.

BACKGROUND

Repeaters used on undersea optical fibers are typically powered using on-shore, constant current, power supplies located at the terminal ends of the optical cable. The electrical power used by each repeater on the optical cable is carried by the inner conductor of a coaxial cable that also carries the data transport optical fibers. The water surrounding the coaxial cable provides an earth ground outer conductor. The inner conductor may be maintained at a voltage as high as 10 kV. Inside each repeater a shunt converter circuit is inserted to drop power sufficient to run the pump lasers and related electronics. The circuitry may be at a potential as high as the operating voltage of the central conductor. The housing for the repeater is in contact with the surrounding water and is therefore at earth ground potential. Hence, the structure containing the electronics within the repeater housing must be electrically isolated from the housing. In addition, the repeater electronics generate heat during operation. Thus, a thermal path must link the repeater electronics to the surrounding water to provide cooling and prevent overheating and premature failure of the repeater electronics.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

Figure 1:
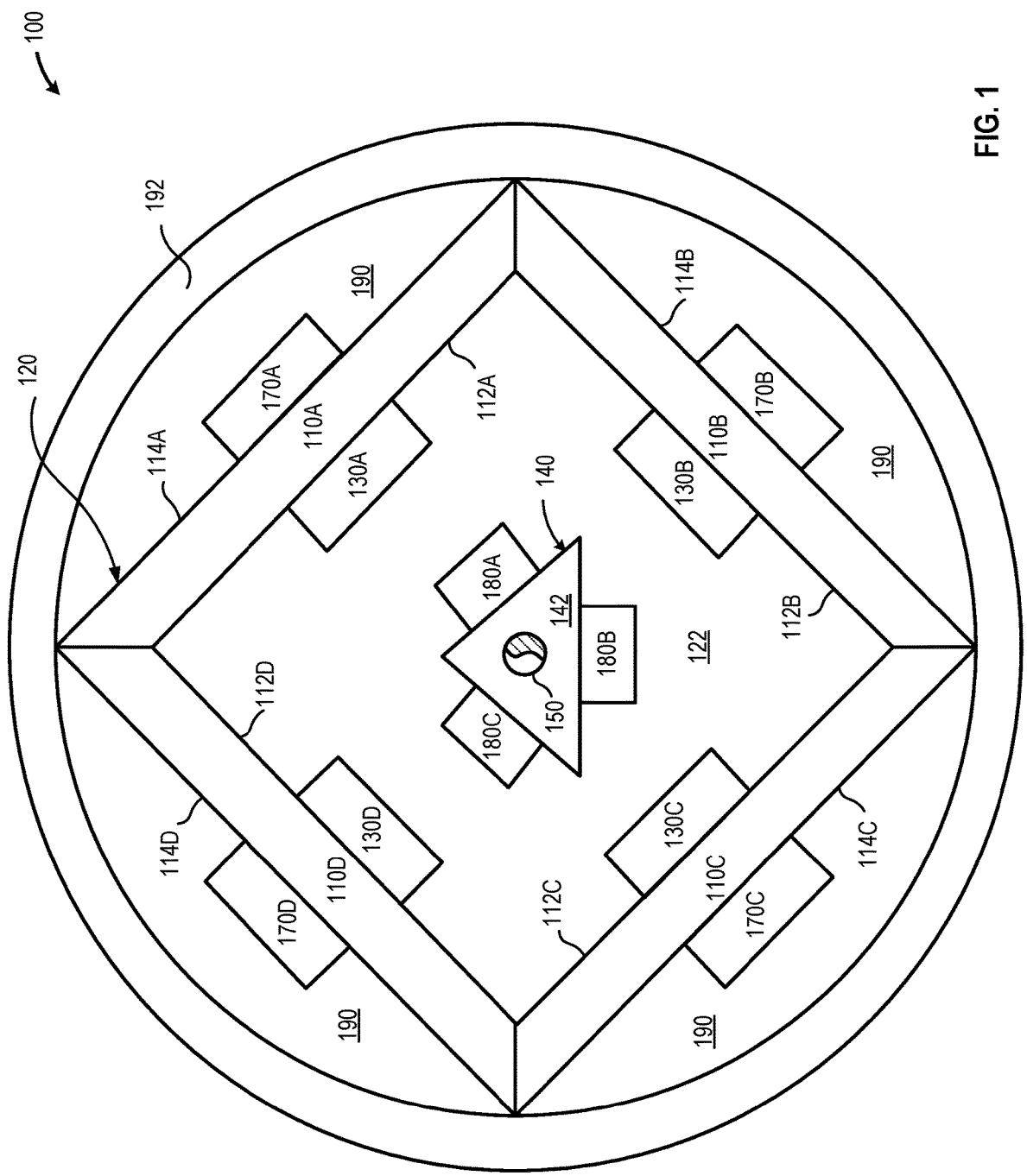
FIG. 1 is a cross-sectional diagram of an illustrative optical repeater system in which a plurality of thermally conductive ceramic members form a hollow structure to which one or more optical repeaters are mounted on the interior surfaces of the hollow structure and in which each of the plurality of thermally conductive ceramic members is fabricated using a material having a relatively high first thermal conductivity and a relatively high dielectric constant, in accordance with at least one embodiment described herein.

Although the following Detailed Description will proceed with reference being made to illustrative embodiments, many alternatives, modifications and variations thereof will be apparent to those skilled in the art.

DETAILED DESCRIPTION

The systems and methods disclosed herein provide a submarine optical repeater in which the repeater electronics are disposed inside a hollow structure formed using a plurality of physically coupled ceramic members that electrically isolates the relatively high voltage repeaters from the surrounding water at earth ground potential but which thermally couples the repeaters to the surrounding water to maintain the operating temperature of the repeaters within an acceptable temperature range. The systems and methods described herein form the hollow structure using ceramic members that include one or more materials, such as aluminum nitride (AlN), that demonstrates a high thermal conductivity (e.g., 150 Watts/meter-Kelvin (W/m-K) to 250 W/m-K) and a relatively high dielectric constant (e.g., 125 kilovolts/centimeter (kV/cm) to 200 kV/cm). The power distribution systems and/or circuitry and the repeater circuitry are disposed inside the hollow structure. The optical repeaters may be physically affixed to the inner surfaces of the ceramic members to maximize the heat transfer from the repeater through the ceramic material to the relatively cool surrounding water. One or more thermally conductive materials maintained at the potential of the surrounding water may be disposed about at least a portion of the external perimeter of the hollow structure. The hollow structure and the one or more thermally conductive materials may be disposed inside a rigid housing, such as an aluminum or stainless steel tube or similar. The systems and methods described herein mount the electronics on ceramic members thereby enabling the positioning of the high voltage/sea ground interface at any point within the repeater housing without compromising the thermal path between the heat producing components and the surrounding water.

An example implementation of the systems and methods described herein includes three planar ceramic members arranged to form a triangular hollow structure. The planar ceramic members may be formed using a material, such as aluminum nitride, having a relatively high thermal conductivity and a relatively high dielectric constant. The high voltage conductor and the power consuming devices are disposed in the interior of the triangular hollow structure. The triangular hollow structure is surrounded by a thermally conductive material that is conductively coupled to the surrounding water (i.e., at earth ground potential). A thermally conductive housing, for example stainless steel or beryllium bronze tubing, may surround the thermally conductive material.

As used herein the term "longitudinal" refers to an orientation that is generally parallel to the relatively high-voltage conductive element disposed in the interior region of the hollow structure formed by the thermally conductive ceramic members.

A submarine optical repeater is provided. The optical repeater may include: a plurality of thermally conductive ceramic members arranged to form a hollow structure that defines an internal volume, has a plurality of internal surfaces, and an external perimeter. Each of the plurality of thermally conductive ceramic members may include an electrically insulative material having a first dielectric strength and a first thermal conductivity. The optical repeater may additionally include a power distribution member disposed at least partially in the internal volume, the power distribution member including at least one conductor to carry a relatively high first voltage, at least one optical repeater disposed on at least one of the plurality of inner surfaces of the hollow structure and coupled to the at least one conductor, and a thermally conductive material disposed about at least a portion of the external perimeter of the hollow structure. The thermally conductive material may include a material having a second thermal conductivity that is greater than the first thermal conductivity. The thermally conductive material may include one or more materials that operate at a relatively low second voltage. The optical repeater may additionally include a housing disposed about at least a portion of an external perimeter formed by the thermally conductive material. The housing may include one or more materials having a third thermal conductivity that is greater than the first thermal conductivity. The housing may operate at the relatively low second voltage.

A method of fabricating a submarine optical repeater is provided. The method may include: arranging each of a plurality of thermally conductive ceramic members to form a hollow structure having an internal space defined by an interior surface of each of the thermally conductive ceramic members, each of the plurality of ceramic members having a respective internal surface and including an electrically insulative material having a first dielectric strength and a first thermal conductivity; disposing a power distribution member at least partially in the internal volume of the hollow structure, the power distribution member including at least one conductive member to operate at a relatively high first voltage; disposing one or more optical repeaters on at least one of the plurality of inner surfaces of the hollow structure; conductively coupling the one or more repeaters to the at least one conductor; disposing a thermally conductive material about at least a portion of an external perimeter of the hollow structure, the thermally conductive material to operate at a relatively low second voltage, the thermally conductive material including a material having a second thermal conductivity greater than the first thermal conductivity; and disposing a housing about at least a portion of the thermally conductive material, the housing to operate at the relatively low second voltage, the housing including a material having a third thermal conductivity greater than the first thermal conductivity.

A method of repeating an optical signal via a submarine optical repeater is provided. The method may include: applying a relatively high first voltage to a conductive member disposed at least partially in an interior volume of a hollow structure formed by a plurality of thermally conductive ceramic members, the plurality of thermally conductive ceramic members having a respective plurality of internal surfaces forming an internal volume, each of the plurality of thermally conductive ceramic members including an electrically insulative material having a first dielectric strength and a first thermal conductivity. The method may further include: receiving at least one optical signal by each of a plurality of optical repeaters coupled to the internal surface of at least one of the plurality of thermally conductive ceramic members; generating, by each of the plurality of optical repeaters, an optical output signal; communicating the optical output signal to an optical fiber disposed outside of the interior space formed by the plurality of thermally conductive ceramic members; conveying thermal energy generated by each of the plurality of optical repeaters through the thermally conductive ceramic member attached to the respective optical repeater and through a thermally conductive material disposed about at least a portion of an exterior perimeter of the hollow structure, the thermally conductive material including at least one material having a second thermal conductivity that is greater than the first thermal conductivity; conveying the thermal energy transmitted by the thermally conductive member through a housing disposed about at least a portion of the thermally conductive material, the housing including a material having a third thermal conductivity that is greater than the first thermal conductivity; and maintaining the thermally conductive material and housing at a relatively low second voltage.

FIG. 1 is a cross-sectional diagram of an illustrative optical repeater system 100 in which a plurality of thermally conductive ceramic members 110A-110D (collectively, "thermally conductive ceramic members 110") form a hollow structure 120 to which one or more optical repeaters 130A-130D (collectively, "optical repeaters 130") are mounted on the interior surfaces 112A-112D (collectively, "interior surfaces 112") of the hollow structure 120 and in which each of the plurality of thermally conductive ceramic members 110 is fabricated using a material having a relatively high first thermal conductivity and a relatively high dielectric constant, in accordance with at least one embodiment described herein. A power distribution member 140 is at least partially disposed in the interior space 122 in the hollow structure 120. The power distribution member 140 includes a conductive element 150 maintained at a first, relatively high, voltage ($V_1$) and may include a structure 142 that carries the cable leads connecting the conductive element 150 to power distribution circuits 180A-180C (collectively, "power distribution circuits 180") that may include, but are not limited to: shunt converter circuitry; surge suppression circuitry; DC/DC converter circuitry; or combinations thereof.

In operation, the region 122 within the hollow structure is maintained at the relatively high first voltage while some or all of the elements disposed external to the hollow structure 120 are maintained at a relatively low second voltage ($V_2$). The thermally conductive ceramic members 110 provide a thermally conductive pathway for the thermal energy generated during operation of the optical repeaters 130 and other electrical components disposed in the hollow structure 120 to flow outward into the ambient environment surrounding the optical repeater system 100. For example, the thermal energy generated during operation of the optical repeaters 130 and/or the electrical components in the hollow structure 120 in a submarine optical repeater system 100 flows outwardly and into the surrounding water. Beneficially, the thermally conductive ceramic members 110 have a relatively high dielectric constant that prevents shorting of the region inside the hollow member 120 to the external region surrounding the optical repeater system 100. The use of the ceramic members 110 offers a significant improvement over prior optical repeater systems that employ an electrical insulator having a relatively low thermal conductivity to isolate the relatively high voltage components (e.g., the optical couples and attendant power supply circuitry) from the surrounding water at a relatively low earth ground voltage. Such prior systems required a significantly larger surface area to effectively dissipate the heat generated by the optical repeaters.

A thermally conductive material 190 at least partially surrounds the hollow structure 120. The thermally conductive material 190 assists in the transfer of thermal energy from the components and/or circuitry disposed in, on, or about the hollow structure 120. In embodiments, the thermally conductive material 190 at least partially surrounding the hollow structure 120 may be maintained at the potential or voltage of the surrounding environment. For example, the thermally conductive material 190 surrounding the hollow structure 120 may be maintained at a second voltage equal to an earth ground potential. A housing 192 at least partially surrounds and/or encapsulates the thermally conductive material 190. In embodiments, the housing 192 may include a high strength and/or structurally rigid material having a relatively high thermal conductivity, such as beryllium bronze or stainless steel.

One or more circuits and/or optical system components 170A-170D (collectively, "optical system components 170") may be disposed on one or more external surfaces 114A-114D (collectively, "external surfaces 114") of the thermally conductive ceramic members 110 forming the hollow structure 120. Such optical system components 170 may include one or more circuits capable of operation in the relatively low voltage environment external to the hollow structure 120. For example, the one or more optical system components 170 may include circuitry or optical components disposed in, on, about, or across all or a portion of one or more external surfaces 114 of the thermally conductive ceramic members 110. Some or all of the optical system components 170 may be encapsulated in a dielectric material may be disposed in, on, about, or across all or a portion of one or more external surfaces 114 of the thermally conductive ceramic members 110. In operation, power flows from the relatively high voltage conductive element 150 through the power distribution circuits 180 to the optical repeaters 130 disposed on the interior surfaces 112 of the ceramic members 110 to the relatively low voltage environment disposed about the hollow structure 120.

The plurality of thermally conductive ceramic members 110 form the hollow structure 120. In embodiments, the plurality of thermally conductive ceramic members 110 may include any currently available or future developed thermally conductive electrical insulator, such as a ceramic material having a relatively high thermal conductivity and a relatively high dielectric constant. Each of the plurality of thermally conductive ceramic members 110 may have the same or different physical geometry, size, or dimensions. In some embodiments, each of the thermally conductive ceramic members 110 may include a planar thermally conductive ceramic member. The thermally conductive ceramic members 110 may include one or more thermally conductive and electrically insulative compounds such as: aluminum nitride (AlN); beryllium oxide (BeO); and similar. In embodiments, the thermally conductive ceramic members 110 may include a one or more one or more thermally conductive and electrically insulative ceramic materials embedded in a host material or carrier matrix. For example, the thermally conductive ceramic members 110 may include one or more ceramic materials embedded in a hydrophobic host material or carrier matrix, such as Nylon 12 or similar. In embodiments, each of some or all of the plurality of thermally conductive members 110 may be formed as a unitary structure. In other embodiments, each of some or all of the plurality of thermally conductive members 110 may be formed by permanently affixing or detachably attaching a plurality of smaller thermally conductive members together to form the thermally conductive member 110. In embodiments, each of the plurality of thermally conductive ceramic members 110 may have a thermal conductivity of: greater than about 25 Watts/meter-Kelvin (W/m-K); greater than about 50 W/m-K; greater than about 100 W/m-K; greater than about 125 W/m-K; greater than about 150 W/m-K; greater than about 175 W/m-K; greater than 200 W/m-K; greater than about 250 W/m-K; or greater than about 300 W/m-K. In embodiments, each of the thermally conductive ceramic members 110 may have a dielectric constant of: greater than about 50 kilovolts/centimeter (kV/cm); greater than about 75 kV/cm; greater than about 100 kV/cm; greater than about 125 kV/cm; greater than about 150 kV/cm; or greater than about 175 kV/cm. Each of the thermally conductive ceramic members 110 may have any thickness. In embodiments, each of the thermally conductive ceramic members 110 may have a thickness of: less than about 2 millimeters (mm) or less; less than about 5 mm; less than about 7 mm; less than about 10 mm; less than about 12 mm; less than about 15 mm; or less than about 20 mm.

Any number of thermally conductive ceramic members 110 may be coupled to form the hollow structure 120. In embodiments, some or all of the thermally conductive ceramic members 110 forming the hollow structure may be curved, arched, arcuate, or similar. In embodiments, some or all of the thermally conductive ceramic members 110 forming the hollow structure 120 may be planar. In embodiments, the thermally conductive ceramic members 110 may include any number of planar thermally conductive ceramic members 110A-110n that are coupled along longitudinal edges to form a hollow structure 120 having a polygonal cross section. For example, three thermally conductive ceramic members 110A-110C may be coupled along longitudinal edges to form a hollow structure 120 having a triangular cross-sectional profile. In another example, six thermally conductive ceramic members 110A-110F may be coupled along longitudinal edges to form a hollow structure 120 having a hexagonal cross-sectional profile.

The thermally conductive ceramic members 110 may be coupled using any number and/or combination of currently available and/or future developed connection systems, materials, and/or devices capable of affixing the thermally conductive ceramic members 110 to form a hollow structure 120 having a defined cross-sectional profile. In some embodiments, the thermally conductive ceramic members 110 may be chemically and/or thermally detachably or non-detachably bonded together along the longitudinal edges of some or all of the thermally conductive ceramic members 110. In some embodiments, the thermally conductive ceramic members 110 may be detachably or non-detachably coupled together along the longitudinal edges of some or all of the thermally conductive ceramic members 110 using one or more fasteners, clips, or similar removable or non-removable devices. The coupled thermally conductive ceramic members 110 form the hollow structure 120. Some or all of the components and/or circuitry disposed at least partially within the interior space 122 of the hollow structure 120 may be maintained at the relatively high first voltage, $V_1$.

Each of the plurality of optical repeaters 130A-130D are disposed in, on, or about at least a portion of an inner surface 112A-112D of an thermally conductive ceramic members 110A-110D forming the hollow structure 120. In embodiments, each of the optical repeaters 130 may be thermally conductively coupled, for example using a thermally conductive mastic or similar material, to the respective thermally conductive ceramic member 110. The optical repeaters 130 may include any number and/or combination of currently available and/or future developed systems and/or devices capable of receiving and rebroadcasting an optical signal. The optical repeaters 130 conductively couple to and receive power from the conductive element 150 carried by the power distribution member 140.

The power distribution member 140 is disposed at least partially within the interior space 122 of the hollow structure 120 formed by the thermally conductive ceramic members 110. The conductive element 150 may be disposed in, on, or about the power distribution member 140. In some embodiments, the conductive element 150 may be disposed in an interior space 142 of the power distribution member 140. The conductive element 150 may operate at a relatively high first voltage compared to the relatively low second voltage of the thermally conductive material 190 and housing 192 disposed external to the hollow structure 120. In embodiments, the conductive element 150 may be at a first voltage of: greater than about 250 volts (V); greater than about 500V; greater than about 1 kV; greater than about 2.5 kV; greater than about 5 kV; or greater than about 10 kV with respect to the second voltage. In addition to the conductive element 150, one or more power distribution circuits 180 may be disposed in, on, or about the power distribution member 140.

One or more cable leads conductively couple the power distribution circuits 180 to the optical repeaters 130. The power distribution circuits 180 provide clean, filtered, power at an appropriate voltage to some or all of the optical repeaters 130 and/or some or all of the optical system components 170. The optical system components 170 may include any number and/or combination of components and/or circuits capable of operating in an environment at the relatively low second voltage. The power distribution circuits 180 may include, but are not limited to: one or more shunt converters; one or more surge suppressors; one or more DC/DC converters; or combinations thereof. The power distribution circuits 180 conductively couple to the conductive element 150.

The interior space 122 of the hollow structure 120 may include void space or may be partially or completely filled with a dielectric or similar material. A thermally conductive material 190 may at least partially surround the exterior surfaces 114A-114D of the thermally conductive ceramic members 110A-110D forming the hollow structure 120. In embodiments, the thermally conductive material 190 may include any number and/or combination of currently available and/or future developed materials capable of effectively and efficiently conveying thermal energy from the external surfaces 114 of the thermally conductive ceramic members 110 to the housing 192. In embodiments, the thermally conductive material 190 may include one or more thermally conductive and electrically insulative materials, such as aluminum oxide ($Al_2O_3$ i.e., alumina) and/or other ceramic materials having a thermal conductivity of: greater than about 25 Watts/meter-Kelvin (W/m-K); greater than about 50 W/m-K; greater than about 100 W/m-K; greater than about 125 W/m-K; greater than about 150 W/m-K; greater than about 175 W/m-K; greater than 200 W/m-K; greater than about 250 W/m-K; or greater than about 300 W/m-K. The thermally conductive material 190 may be maintained at the relatively low second voltage. In embodiments, the thermally conductive material 190 may be maintained at the voltage of the environment surrounding the optical repeater system 100.

A housing 192 at least partially surrounds the thermally conductive material 190. The housing 192 may include any material or combination of materials having a fair thermal conductivity and capable of protecting the contents of the optical repeater system 100 from the external environment. In embodiments, the housing 192 may encapsulate the optical repeater system 100 and may include connectors and/or couplings to facilitate the pass through of power via the conductive element 150 and/or optical signals via one or more optical fibers. In some implementations, the housing 192 may hermetically seal the optical repeater system 100 from the external environment. The housing 192 may be fabricated from one or more metals that include, but are not limited to: aluminum and/or aluminum containing compounds, stainless steel, beryllium and/or beryllium containing compounds, titanium and/or titanium containing compounds and similar materials. Although depicted as round in FIG. 1, the housing 192 may have any physical geometry, size, shape, or configuration.

Figure 2:
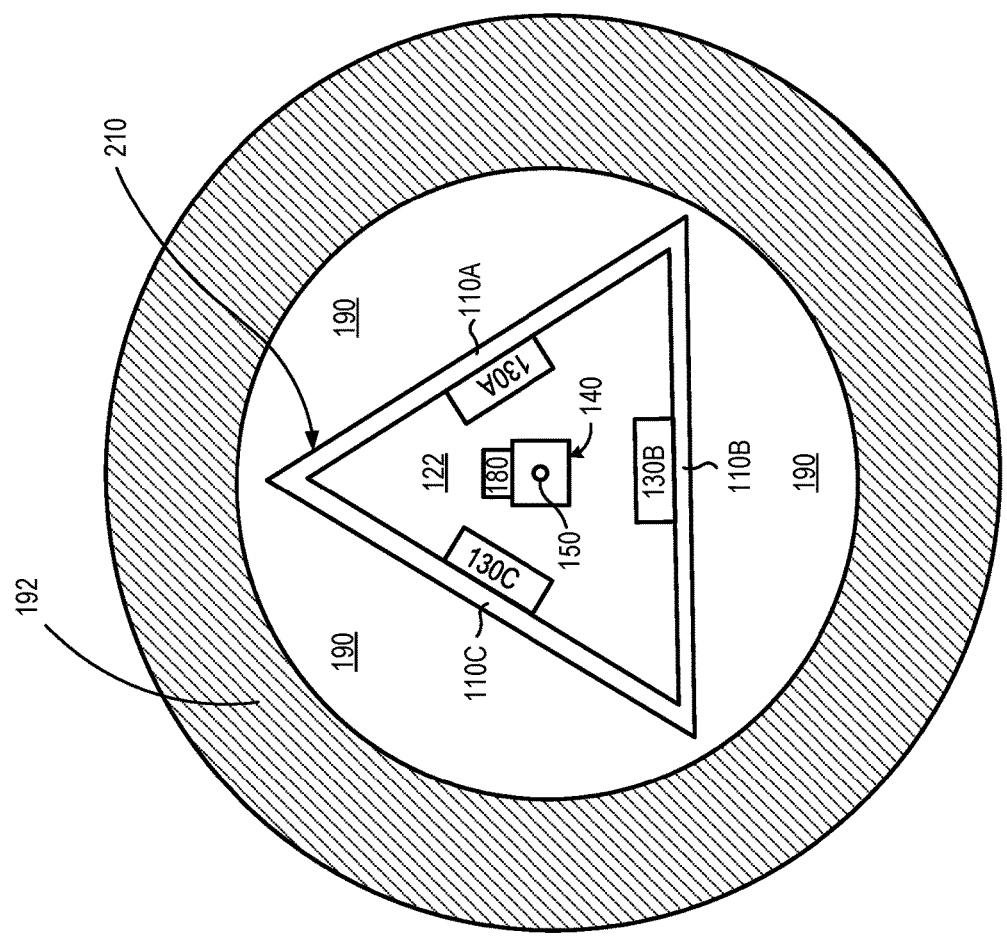
FIG. 2 is a cross-sectional elevation of an illustrative optical repeater system in which three thermally conductive ceramic members are disposed to form a polygonal hollow structure in the form of an equilateral triangle, in accordance with at least one embodiment described herein.

FIG. 2 is a cross-sectional elevation of an illustrative optical repeater system 200 in which three thermally conductive ceramic members 110A-110C are disposed to form a polygonal hollow structure 210 in the form of an equilateral triangle, in accordance with at least one embodiment described herein. As depicted in FIG. 2, three thermally conductive ceramic members 110A-110C may be longitudinally joined along edges to form the triangular hollow structure 210. The power distribution member 140, carrying the conductive element 150 may be disposed within the internal volume 122 of the triangular hollow structure 210. The thermal output of the components maintained at the relatively high first voltage of the conductive element 150 is conducted away from the thermally conductive ceramic members 110 by the thermally conductive material 190, thereby creating a radially outward flow of thermal energy through the optical repeater system 100.

Figure 3:
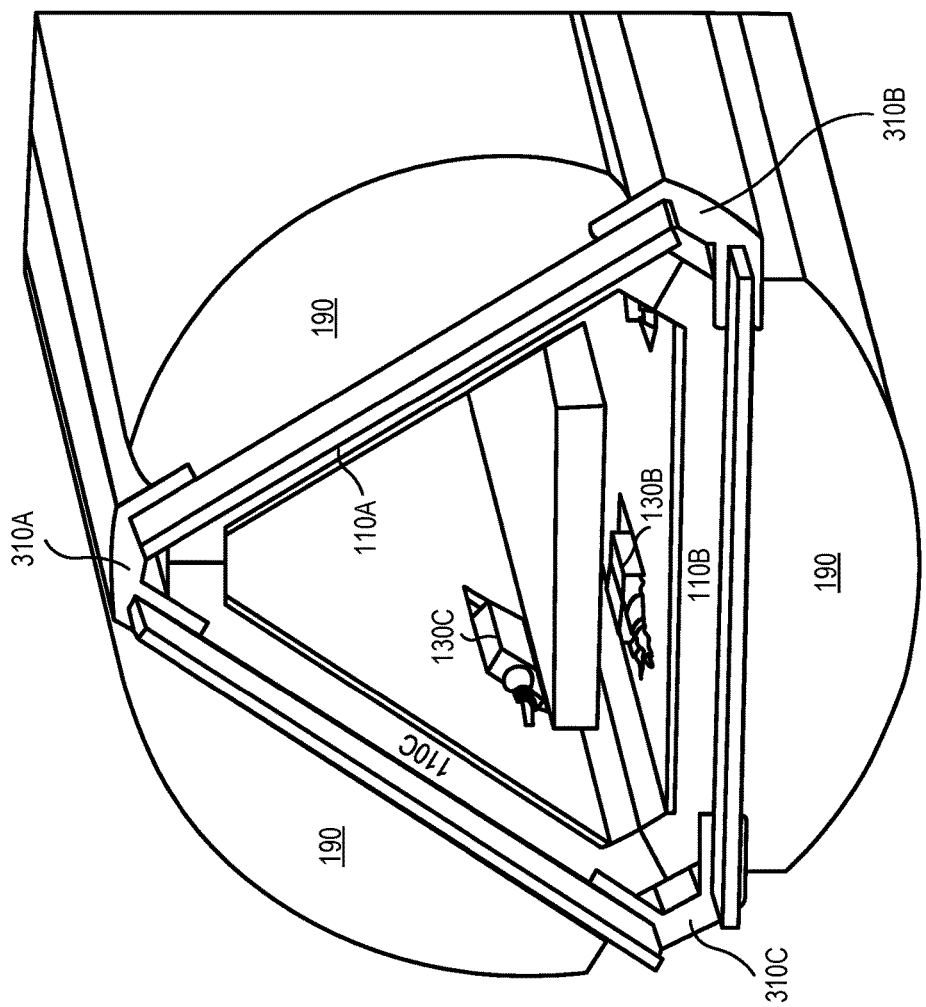
FIG. 3 is a perspective view of an illustrative optical repeater system in which three generally planar thermally-conductive ceramic members are longitudinally coupled along the edges using a plurality of connectors, in accordance with at least one embodiment described herein.

FIG. 3 is a perspective view of an illustrative optical repeater system 300 in which three generally planar thermally-conductive ceramic members 110A-110C are longitudinally coupled along the edges using a plurality of connectors 310A-310C, in accordance with at least one embodiment described herein. As depicted in FIG. 3, in embodiments, the thermally conductive material 190 may include one or more rigid, thermally conductive members 190 disposed proximate the external surface 114 of the thermally conductive ceramic members 110A-110C.

Figure 4:
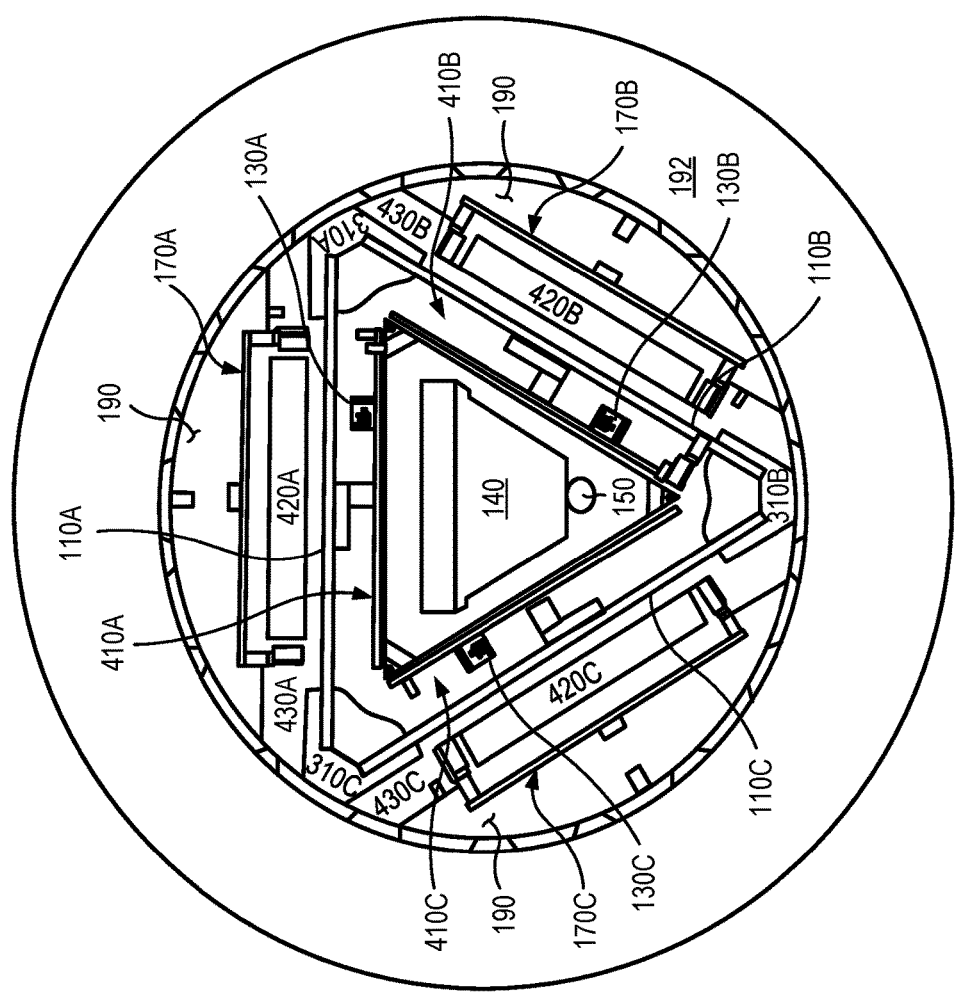
FIG. 4 is a cross-sectional elevation of an illustrative optical repeater system in which three generally planar thermally-conductive ceramic members are longitudinally coupled along the edges using a plurality of connectors, in accordance with at least one embodiment described herein.

FIG. 4 is a cross-sectional elevation of an illustrative optical repeater system 400 in which three generally planar thermally-conductive ceramic members 110A-110C are longitudinally coupled along the edges using a plurality of connectors 310A-310C, in accordance with at least one embodiment described herein. As depicted in FIG. 4, one or more circuit boards 410A-410C (collectively, "circuit boards 410") may be disposed proximate the interior surface 112A-112C of the thermally conductive ceramic members 110A-110C. In embodiments, the optical repeaters 130A-130C may be disposed in, on, or about the one or more circuit boards 410. In addition to the one or more optical repeaters 130, one or more shunt converter circuits may be disposed in, on, or about the one or more circuit boards 410.

As depicted in FIG. 4, the optical system components 170 may include one or more gain blocks 420A-420C and one or more optical modules 430A-430C. The optical system components 170 may be disposed proximate the external surface 114A-114C of some or all of the thermally conductive ceramic members 110A-110C, or inside optical module or inside gain block 420.

Figure 5:
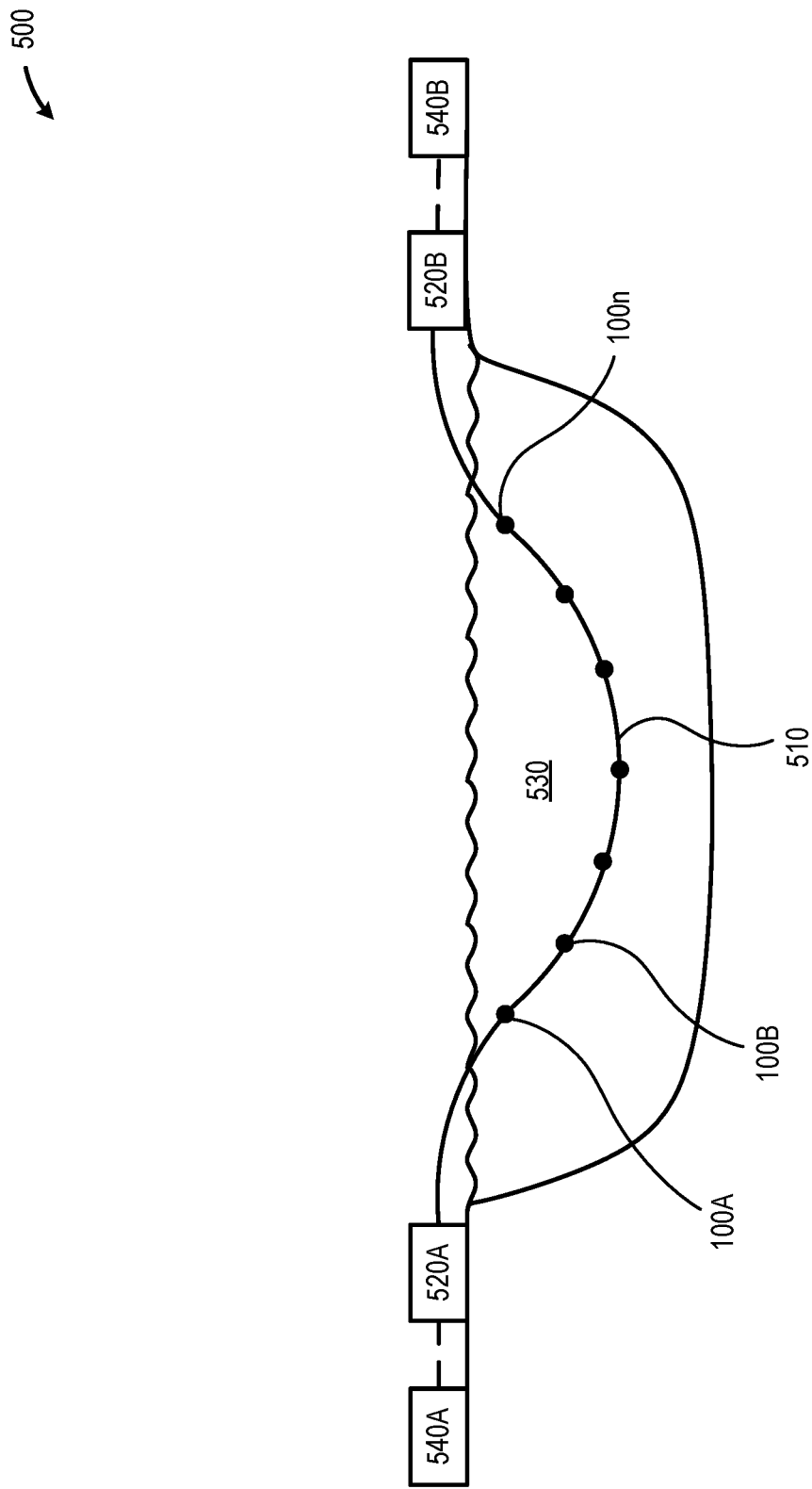
FIG. 5 is a schematic diagram of an illustrative submarine fiber optic communication system in which an optical cable that includes a plurality of optical repeater systems communicably couples a first optical transceiver to a remote second optical transceiver 510B, in accordance with at least one embodiment described herein.

FIG. 5 is a schematic diagram of an illustrative submarine fiber optic communication system 500 in which an optical cable 510 that includes a plurality of optical repeater systems 100A-100n communicably couples a first optical transceiver 520A to a remote second optical transceiver 520B, in accordance with at least one embodiment described herein. As depicted in FIG. 5, the optical cable 510 may include any number of individual optical communication fibers and at least one conductive element 150 operating at the relatively high first voltage. Signals communicated along the optical cable 510 are received by some or all of the optical repeater systems 100A-100n disposed at regular or irregular intervals along the optical cable 510. Each of the optical repeaters 100A-100n receives, amplifies, and retransmits optical signals carried by one or more optical fibers included in the optical cable 510.

The one or more conductive elements 150A-150n provide power to each of the optical repeater systems 100A-100n along the optical cable 510. The optical repeater systems 100A-100n consume power to amplify and retransmit the optical signals carried by some or all of the bundled optical fibers included in an optical cable 510, at least a portion of which may be submerged in a body of water 530. In embodiments, the optical cable 510 may include tens, hundreds, or even thousands of individual optical fibers. In embodiments, the optical cable 510 may include any number of conductive elements 150A-150n, each operating at the relatively high first voltage. In embodiments, the optical cable 510 may be disposed at least partially in a marine environment 530.

The first optical transceiver 520A and the second optical transceiver 520B may include one or more respective, constant current, power supplies 540A, 540B that provide power to the conductive elements 150 included in the optical cable 510. In embodiments, the first optical transceiver 520A and the second optical transceiver 520B may include one or more power supplies capable of generating a first voltage of: greater than about 250 volts (V); greater than about 500V; greater than about 1 kV; greater than about 2.5 kV; greater than about 5 kV; or greater than about 10 kV.

Figure 6:
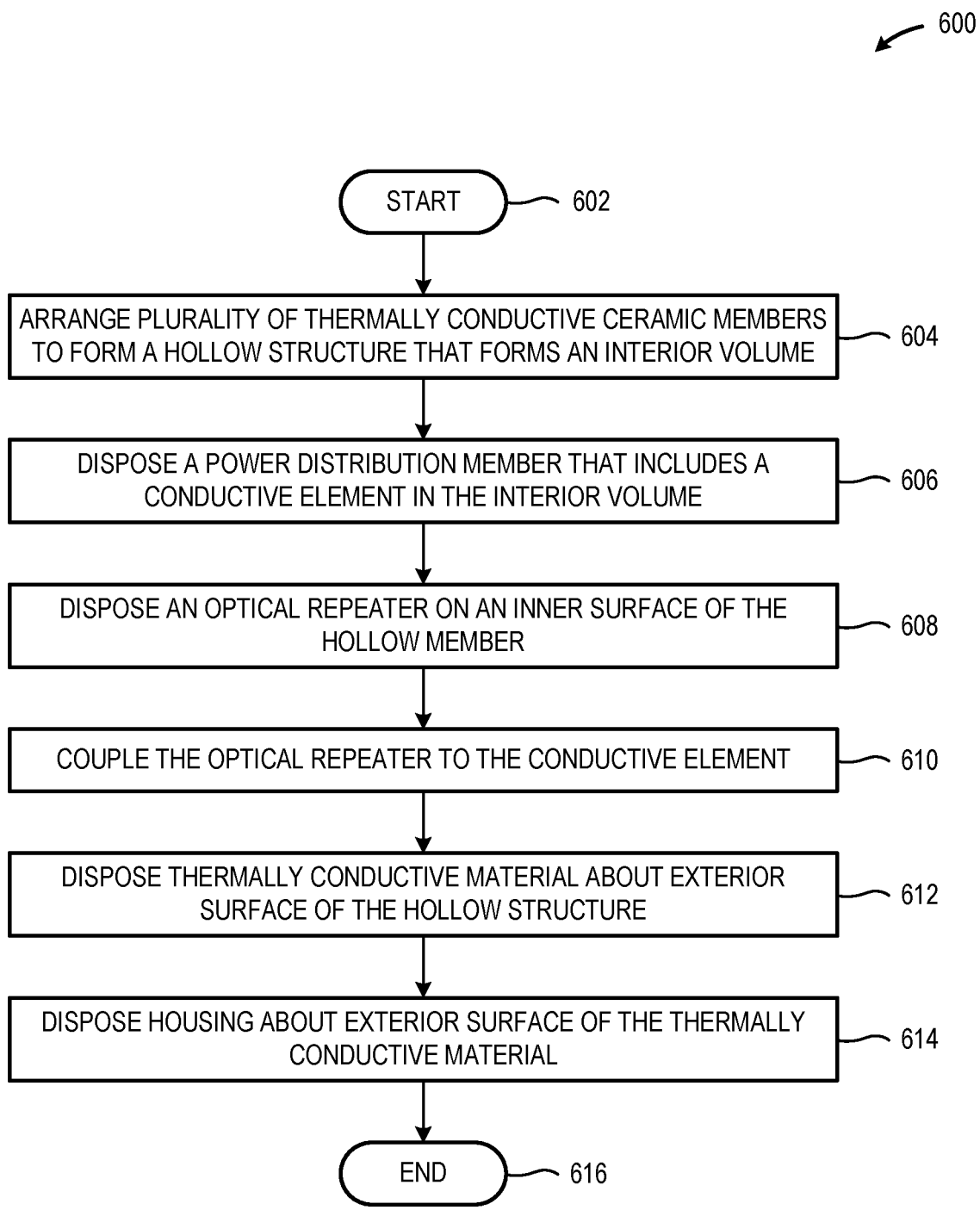
FIG. 6 is a flow diagram of an illustrative submarine optical repeater fabrication method, in accordance with at least one embodiment described herein.

FIG. 6 is a flow diagram of an illustrative submarine optical repeater fabrication method 600, in accordance with at least one embodiment described herein. The method commences at 602.

At 604, a plurality of thermally conductive ceramic members 110 are arranged to form a hollow structure 120 having an internal space 122 defined by an interior surface 112 of each of the thermally conductive ceramic members 110. Each of the plurality of ceramic members 110 may be fabricated or otherwise formed using an electrically insulative material having a first dielectric strength and a first thermal conductivity. In embodiments, the thermally conductive ceramic members 110 may include non-planar members, such as curved, arched, arcuate, or faceted members. In embodiments, the thermally conductive ceramic members 110 may include planar ceramic members.

At 606, a power distribution member 140 is disposed at least partially within the interior volume 122 of the hollow structure 120. The power distribution member 140 may include a hollow member having an interior volume 142. One or more conductive elements 150 may be disposed in, on, or about the power distribution member 140. In embodiments, the conductive element 150 may operate at a relatively high first voltage. The first voltage may be greater than 10 kV.

At 608, one or more optical repeaters 130 are positioned, placed, or otherwise disposed in, on, about or across at least a portion of the interior surface 112 of one or more of the thermally conductive ceramic members 110 forming the hollow structure 120. In embodiments, the optical repeaters 130 may be detachably or non-detachably attached to the inner surface 112 of the one or more thermally conductive ceramic members 110.

At 610, the one or more optical repeaters 130 are conductively coupled to the conductive element 150. The power from the conductive element 150 may pass through one or more power distribution circuits 180, such as one or more shunt converters, one or more surge suppressors, and/or one or more DC/DC converters prior to the optical repeaters 130.

At 612, a thermally conductive material 190 may be disposed at least partially about an exterior surface 114 of each of the thermally conductive ceramic members 110 included in the plurality of thermally conductive ceramic members 110. In embodiments, the thermally conductive material 190 may include a material having a thermal conductivity of: greater than about 100 Watts/meter-Kelvin (W/m-K); greater than about 125 W/m-K; greater than about 150 W/m-K; greater than about 175 W/m-K; greater than 200 W/m-K; greater than about 250 W/m-K; or greater than about 300 W/m-K. In some embodiments, the thermal conductivity of the thermally conductive material 190 may be greater than the thermal conductivity of the thermally conductive ceramic members 110.

At 614, a housing 192 is disposed about at least a portion of the thermally conductive material 190. In embodiments, the housing 192 may include a rigid material to provide structural strength to the submarine optical repeater 100. In embodiments, the housing 192 may include a hermetically sealed and/or water-tight housing 192. In embodiments, the housing 192 may include a metallic housing, such as a housing fabricated using aluminum, an aluminum alloy, beryllium, a beryllium alloy, or a stainless steel alloy or titanium. In embodiments, the housing 192 may have a thermal conductivity equal to or greater than the thermally conductive ceramic members 110. In embodiments, the housing 192 may have a thermal conductivity of: greater than about 100 Watts/meter-Kelvin (W/m-K); greater than about 125 W/m-K; greater than about 150 W/m-K; greater than about 175 W/m-K; greater than about 200 W/m-K; greater than about 250 W/m-K; or greater than about 300 W/m-K. The method 600 concludes at 616.

Figure 7:
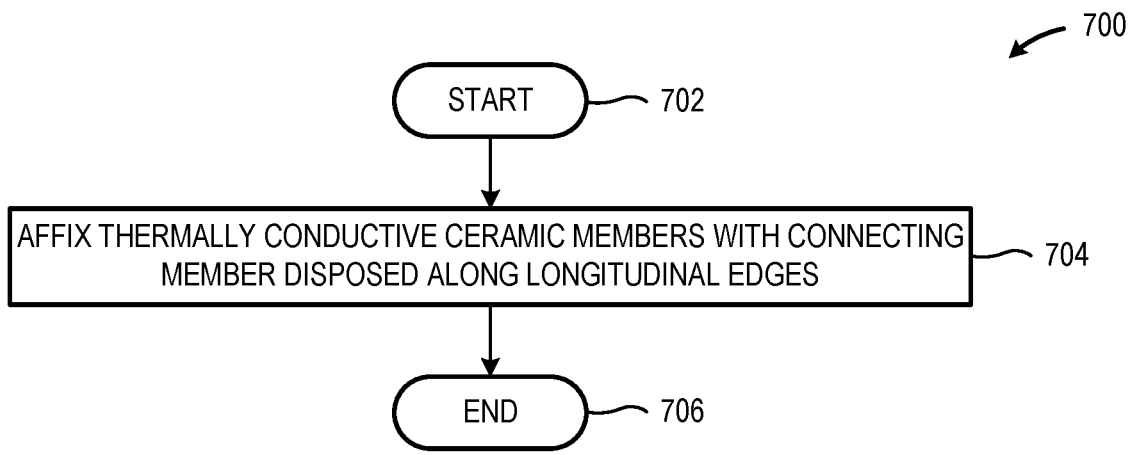
FIG. 7 is a flow diagram of an illustrative method of attaching the longitudinal edges of the thermally conductive ceramic members to form the hollow structure, in accordance with at least one embodiment described herein.

FIG. 7 is a flow diagram of an illustrative method 700 of attaching the longitudinal edges of the thermally conductive ceramic members 110 to the hollow structure 120, in accordance with at least one embodiment described herein.

The method 700 may be used in combination with the method 600 described in detail in FIG. 6. The method 700 commences at 702.

At 704, the plurality of thermally conductive ceramic members 110 may be physically coupled using one or more coupling structures. Such coupling structures may include one or more frames or similar support elements disposed within the hollow structure. Such coupling structures may include one or more connecting members 310, couplers, or similar devices or systems disposed along all or a portion of the longitudinal edges of each thermally conductive ceramic member 110. In embodiments, the connecting members 310 may be physically affixed to the longitudinal edges of the thermally conductive ceramic members 110 to form the hollow structure 120. In other embodiments, the connecting members 310 may be "press" or "resistance" fitted to the longitudinal edges of the thermally conductive ceramic members 110. The method 700 concludes at 706.

Figure 8:
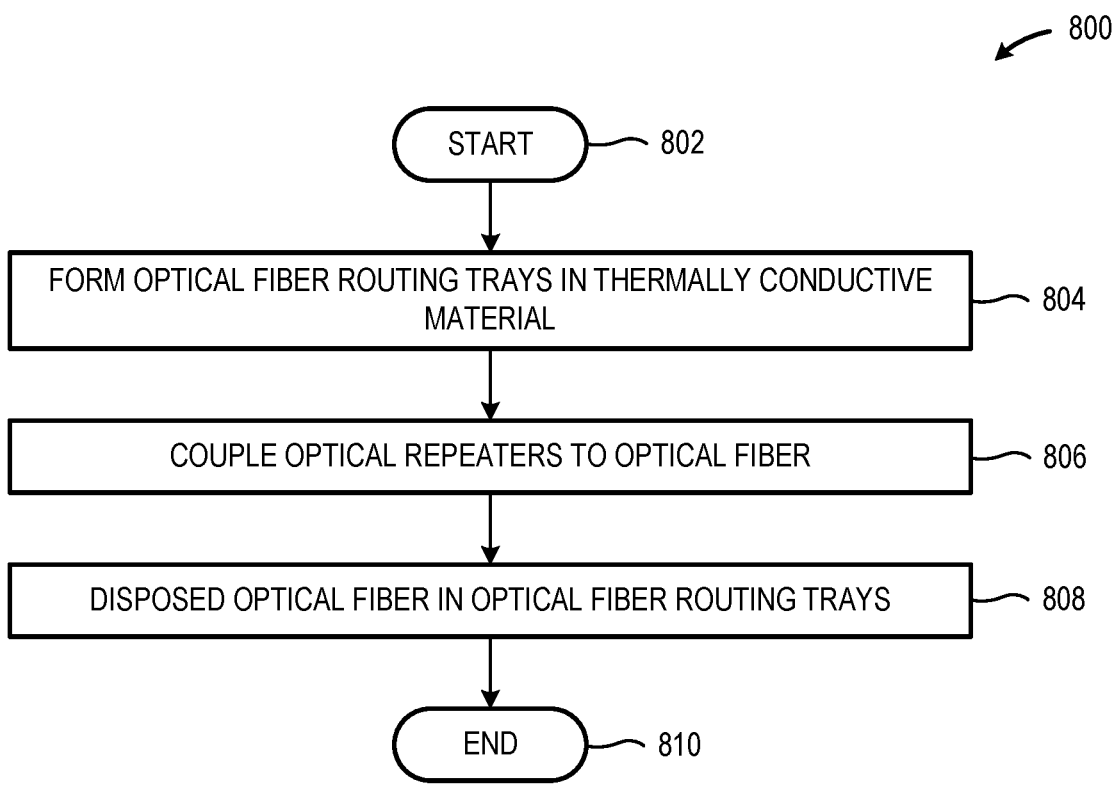
FIG. 8 is a flow diagram of an illustrative method of forming optical fiber trays in the thermally conductive material surrounding the hollow structure and routing optical fibers to/from the optical repeaters disposed in the hollow structure via the fiber trays, in accordance with at least one embodiment described herein.

FIG. 8 is a flow diagram of an illustrative method 800 of forming optical fiber trays in the thermally conductive material 190 surrounding the hollow structure 120 and routing optical fibers to/from the optical repeaters 130 disposed in the hollow structure via the fiber trays, in accordance with at least one embodiment described herein. The method 800 may be used in conjunction with method 600 described in detail in FIG. 6 and/or method 700 described in detail in FIG. 7. The method 800 commences at 802.

At 804, one or more optical fiber routing trays may be formed or otherwise disposed in, on, or about the thermally conductive material 190 that at least partially surrounds the hollow structure 120. In embodiments, the fiber routing trays may be formed directly in the thermally conductive material 190. In embodiments, the fiber routing trays may include one or more inserts that may be fitted into recesses or indentations in the thermally conductive material 190.

At 806, one or more optical fibers are coupled to the optical repeaters 130. In embodiments, the one or more optical fibers may be routed in, around, or through the thermally conductive ceramic member 110 on which the optical repeater 130 is mounted.

At 808, the one or more optical fibers coupled to the optical repeater 130 is disposed, positioned, or otherwise placed in the fiber routing tray. In at least some embodiments, the one or more optical fibers may be routed out of the optical repeater system 100, for example as a fiber included in an optical cable containing multiple fibers. The method 800 concludes at 810.

Figure 9:
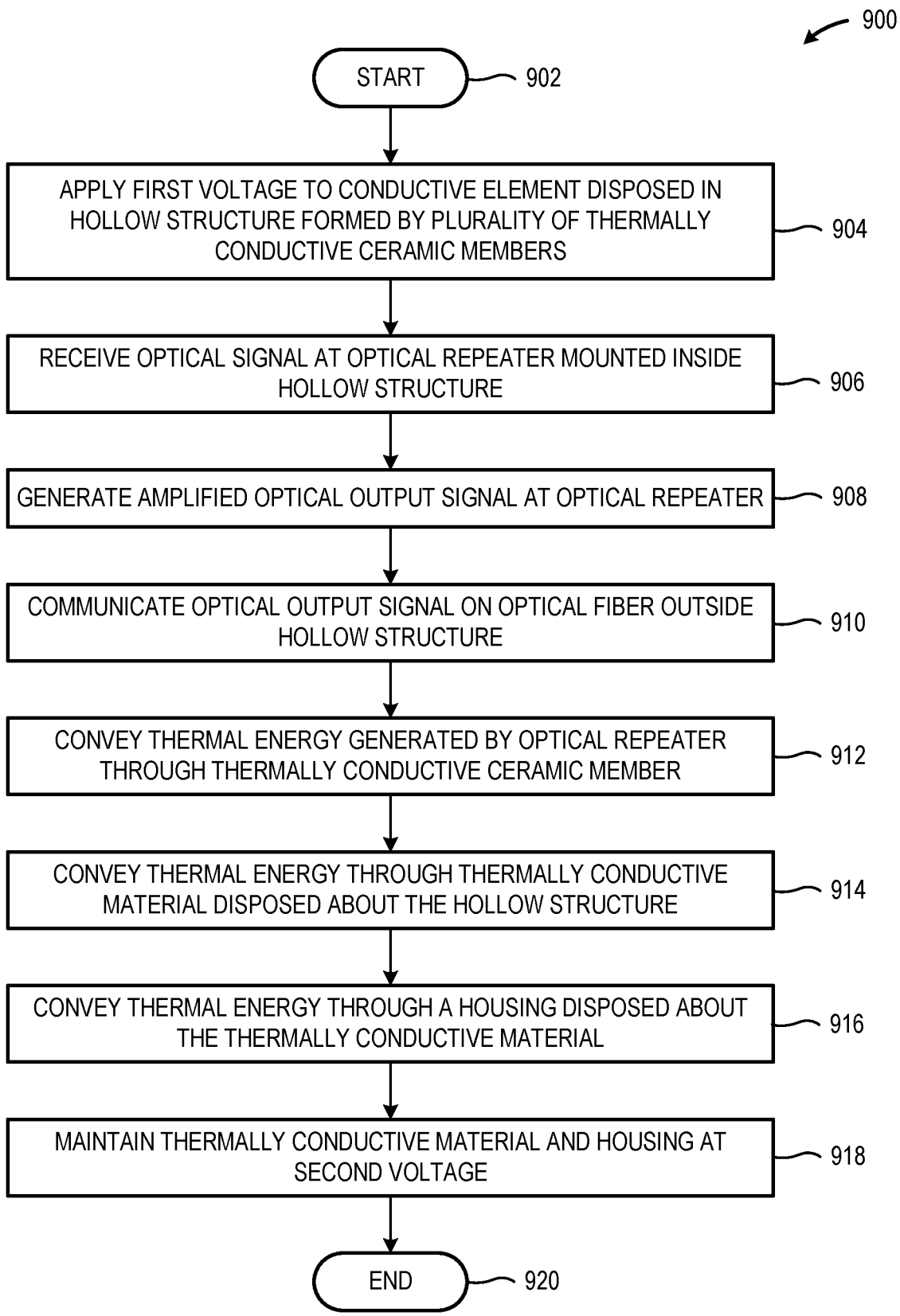
FIG. 9 is a flow diagram of an illustrative communication method using a submarine optical repeater such as described in FIGS. 1 through 4, in accordance with at least one embodiment described herein.

FIG. 9 is a flow diagram of an illustrative communication method 900 using a submarine optical repeater 100 such as described in FIGS. 1 through 4, in accordance with at least one embodiment described herein. In embodiments, submarine optical repeaters 100A-100n may be disposed at regular or irregular intervals along an optical communication cable 510. Optical signals communicated along the optical communications cable 510 may attenuate with increasing distance. The optical repeater systems 100A-100n positioned along the optical communications cable 510 boost signal strength to minimize drops and errors in the optical signals carried by the optical communications cable 510. The method 900 commences at 902.

At 904, a remote power supply 540 provides a relatively high first voltage to a conductive element 150 disposed in a hollow structure 120 formed by a plurality of thermally conductive ceramic members 110A-110n. In embodiments, the conductive element 150 may be carried by and/or disposed in, on, or about a power distribution member 140 disposed in the interior volume 122 of the hollow structure 120 formed by the thermally conductive ceramic members 110. In embodiments, the conductive element may be at a first voltage of: greater than about 250 volts (V); greater than about 500V; greater than about 1 kV; greater than about 2.5 kV; greater than about 5 kV; or greater than about 10 kV. In embodiments, the interior volume 122 of the hollow structure 120 may be maintained at or near the relatively high first voltage carried by the conductive element 150.

At 906, one or more optical signals are received at an optical repeater 130 disposed on an interior surface 112 of one of the thermally conductive ceramic members forming the hollow structure 120.

At 908, the optical repeater 130 amplifies the received optical signal. The power consumed by the optical repeater 130 generates thermal energy.

At 910, the optical repeater 130 retransmits the amplified optical signal.

At 912, the thermal energy generated by the optical repeater 130 is conveyed radially outward through the thermally conductive ceramic member 110 carrying the optical repeater 130. In embodiments, the thermally conductive ceramic member 110 may include one or more materials having a first thermal conductivity.

At 914, the thermal energy flowing through the thermally conductive ceramic member 110 flows radially outward through the thermally conductive material 190 disposed at least partially about the external surface of the hollow structure 120. In embodiments, the thermally conductive material 190 may include one or more materials having a second thermal conductivity that is greater than the first thermal conductivity of the thermally conductive ceramic member 110.

At 916, the thermal energy flowing through the thermally conductive material 190 flows radially outward through the housing 192 disposed at least partially about the external surface of the thermally conductive material 190. In embodiments, the housing 192 may include one or more materials having a third thermal conductivity that is greater than the first thermal conductivity of the thermally conductive ceramic member 110.

At 918, the thermally conductive material 190 and/or the housing 192 may be maintained at a relatively low second voltage. Power may flow radially outward from the relatively high first voltage maintained on the conductive element 150 to the relatively low second voltage maintained about the exterior of the optical repeater system 100. The method 900 concludes at 920.

While FIGS. 6 through 9 illustrate exemplary submarine optical repeater fabrication and communication methods according to one or more embodiments, it is to be understood that not all of the operations depicted in FIGS. 6 through 9 may be necessary for other embodiments. Further the operational sequences depicted in FIGS. 6 through 9 are illustrative and some or all of the operations may be altered, adjusted, or rearranged. Such rearrangement of operations may assist in facilitating automation and/or improving manufacturing efficiency—such rearranged operations should be considered as included within the scope of this disclosure. Indeed, it is fully contemplated herein that in other embodiments of the present disclosure, the operations depicted in FIGS. 6 through 9, and/or other operations described herein, may be combined in a manner not specifically shown in any of the drawings, but still fully consistent with the present disclosure. Thus, claims directed to features and/or operations that are not exactly shown in one drawing are deemed within the scope and content of the present disclosure.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrases "at least one of A, B or C" can mean A; B; C; A and B; A and C; B and C; or A, B and C.

The systems and methods described herein provide a submarine optical repeater in which a plurality of thermally conductive, electrically insulative, ceramic members form a hollow structure having an interior volume that is maintained at a relatively high first voltage when compared to a relatively low second voltage maintained external to the hollow structure. A conductive element at the first voltage disposed in the interior volume provides power to optical repeaters disposed on the interior surface of the hollow structure. Additional optical components and/or circuitry capable of operation at the second voltage may be disposed on the exterior surface of the hollow structure. A thermally conductive material disposed on the external surfaces of the hollow structure and a housing disposed about the thermally conductive material are maintained at the second voltage. The power flows radially outward from the thermal conductive element to the optical repeaters and outward to the surrounding environment about the submarine optical repeater. The thermally conductive ceramic members electrically isolate the optical repeaters from the second voltage while providing a thermally conductive pathway for the heat generated during the operation of the optical repeaters to dissipate into the surrounding environment.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed:

1. A submarine optical repeater, comprising:
   a plurality of thermally conductive ceramic members arranged to form a hollow structure that defines an internal volume, has a plurality of internal surfaces, and an external perimeter;
      wherein each of the plurality of thermally conductive ceramic members includes an electrically insulative material having a first dielectric strength;
      wherein each of the plurality of thermally conductive ceramic members includes a thermally conductive material having a first thermal conductivity;
   a power distribution member disposed at least partially in the internal volume, the power distribution member including at least one conductor to carry a relatively high first voltage; and
   at least one optical repeater disposed on at least one of the plurality of inner surfaces of the hollow structure and coupled to the at least one conductor; and
   optical system components coupled to the one or more optical repeaters, the optical system components disposed on an external surface of at least one of the plurality of thermally conductive ceramic members.

2. The submarine optical repeater of claim 1, further comprising:
   a thermally conductive material disposed about at least a portion of the external perimeter of the hollow structure;
      wherein the thermally conductive material includes a material having a second thermal conductivity that is greater than the first thermal conductivity; and
      wherein the thermally conductive material includes a material to operate at a relatively low second voltage.

3. The submarine optical repeater of claim 2, further comprising:
   a housing disposed about at least a portion of an external perimeter formed by the thermally conductive material;
      wherein the housing includes a material having a third thermal conductivity that is greater than the first thermal conductivity; and
      wherein the housing includes a material to operate at the relatively low second voltage.

4. The submarine optical repeater of claim 1 wherein the plurality of thermally conductive ceramic members comprises a plurality of planar, thermally conductive, ceramic members.

5. The submarine optical repeater of claim 4 wherein the hollow structure comprises a hollow polygonal structure having the internal space defined by the interior surface of each of the plurality of planar, thermally conductive, ceramic members.

6. The submarine optical repeater of claim 5 wherein the plurality of planar, thermally conductive, ceramic members comprises a plurality of planar, thermally conductive members that include polycrystalline aluminum nitride.

7. The submarine optical repeater of claim 5 wherein the plurality of planar ceramic members comprise three planar ceramic members arranged to form a hollow triangular polygonal structure.

8. The submarine optical repeater of claim 5, further comprising electrically insulative corner members disposed at each vertex of the triangular polygonal structure formed by the three planar ceramic members.

9. The submarine optical repeater of claim 1 wherein the at least one optical repeater comprises at least one shunt converter circuit (SCC).

10. The submarine optical repeater of claim 1 wherein each of the plurality of thermally conductive ceramic members comprises a ceramic member having a thermal conductivity of from 25 Watts/meter per Kelvin (W/m-K) to 250 W/m-K.

11. The submarine optical repeater of claim 10 wherein each of the plurality of thermally conductive ceramic members comprises a thermally conductive ceramic member having a dielectric strength of from 120 kilovolts per centimeter (kV/cm) to about 200 kV/cm.

12. The submarine optical repeater of claim 1 wherein the power distribution member further comprises at least one of: one or more shunt converters, one or more surge suppressors, or one or more DC/DC converters coupled to at least one of the one or more optical repeaters.

13. A method of fabricating a submarine optical repeater:
   arranging each of a plurality of thermally conductive ceramic members to form a hollow structure having an internal space defined by an interior surface of each of the thermally conductive ceramic members, each of the plurality of ceramic members having a respective internal surface and including an electrically insulative material having a first dielectric strength and a first thermal conductivity;

disposing a power distribution member at least partially in the internal volume of the hollow structure, the power distribution member including at least one conductive member to operate at a relatively high first voltage;

disposing a thermally conductive material about at least a portion of an external perimeter of the hollow structure, the thermally conductive material to operate at a relatively low second voltage, the thermally conductive material including a material having a second thermal conductivity greater than the first thermal conductivity;

disposing one or more optical repeaters on at least one of the plurality of inner surfaces of the hollow structure; and conductively coupling the one or more repeaters to the at least one conductor.

14. The method of claim 13, further comprising:
disposing a housing about at least a portion of the thermally conductive material, the housing to operate at the relatively low second voltage, the housing including a material having a third thermal conductivity greater than the first thermal conductivity.

15. The method of claim 13 wherein arranging each of the plurality of thermally conductive ceramic members to form the hollow structure having the internal space defined by the interior surface of each of the thermally conductive ceramic members comprises:
arranging each of a plurality of planar, thermally conductive, ceramic members to form the hollow structure having an internal space defined by an interior surface of each of the plurality of planar, thermally conductive, ceramic members.

16. The method of claim 15 wherein arranging each of the plurality of planar, thermally conductive, ceramic members to form the hollow structure having the internal space defined by the interior surface of each of the plurality of planar, thermally conductive, ceramic members comprises:
arranging each of the plurality of planar, thermally conductive, ceramic members to form a hollow polygonal structure having the internal space defined by the interior surface of each of the plurality of planar, thermally conductive, ceramic members.

17. The method of claim 16 wherein arranging each of the plurality of planar, thermally conductive, ceramic members to form the hollow polygonal structure having the internal space defined by the interior surface of each of the plurality of planar, thermally conductive, ceramic members comprises:
arranging each of the plurality of planar, thermally conductive, ceramic members to form the hollow polygonal structure having the internal space defined by the interior surface of each of the plurality of planar, thermally conductive, ceramic members, each of the plurality of planar, thermally conductive, ceramic members including a planar, thermally conductive, aluminum nitride ceramic member.

18. The method of claim 16 wherein arranging each of the plurality of planar, thermally conductive, ceramic members to form the hollow polygonal structure having the internal space defined by the interior surface of each of the plurality of planar, thermally conductive, ceramic members comprises:
arranging three, planar, thermally conductive, ceramic members to form a hollow triangular structure having the internal space defined by the interior surface of each of the three planar, thermally conductive, ceramic members.

19. The method of claim 16, further comprising:
affixing each of the plurality of thermally conductive ceramic members to another of the thermally conductive ceramic members via a connecting member disposed at each vertex of the hollow polygonal structure.

20. The method of claim 13, further comprising:
forming one or more routing trays in the thermally conductive material;
coupling each of the one or more optical repeaters to at least one of a plurality of optical fibers; and
disposing each of the plurality of optical fibers in the one or more routing trays formed in the thermally conductive material.

21. The method of claim 13 further comprising:
disposing amplifier circuitry on an external surface of one or more of the plurality of planar ceramic members, the amplifier circuitry coupled to a respective one of the one or more optical repeaters.

22. The method of claim 13 wherein disposing at least one conductive member within the internal volume of the hollow structure, further comprises:
disposing a power distribution member in the internal volume of the hollow structure, the power distribution member including the at least one conductive member including at least one of: one or more shunt converters, one or more surge suppressors, or one or more DC/DC converters coupled to at least one of the one or more optical repeaters.

23. An optical communication system comprising:
an optical cable that includes one or more optical fibers and a conductive member to operate at a relatively high first voltage; and
at least one submarine optical repeater, the at least one submarine optical repeater including:
a plurality of thermally conductive ceramic members arranged to form a hollow structure that defines an internal volume, has a plurality of internal surfaces, and an external perimeter;
wherein each of the plurality of thermally conductive ceramic members includes an electrically insulative material having a first dielectric strength; and
wherein each of the plurality of thermally conductive ceramic members includes a thermally conductive material having a first thermal conductivity;
a power distribution member disposed at least partially in the internal volume, the power distribution member including the at least one conductor to operate at a relatively high first voltage;
at least one optical repeater disposed on at least one of the plurality of inner surfaces of the hollow structure and coupled to the at least one conductor; and
a thermally conductive material disposed about at least a portion of the external perimeter of the hollow structure;
wherein the thermally conductive material includes a material having a second thermal conductivity that is greater than the first thermal conductivity; and
wherein the thermally conductive material includes a material to operate at a relatively low second voltage.

24. The optical communication system of claim 23, further comprising:
a housing disposed about at least a portion of an external perimeter formed by the thermally conductive material;

wherein the housing includes a material having a third thermal conductivity that is greater than the first thermal conductivity; and wherein the housing includes a material to operate at the relatively low second voltage.

25. A method of repeating an optical signal via a submarine optical repeater:

applying a relatively high first voltage to a conductive member disposed at least partially in an interior volume of a hollow structure formed by a plurality of thermally conductive ceramic members, the plurality of thermally conductive ceramic members having a respective plurality of internal surfaces forming an internal volume, each of the plurality of thermally conductive ceramic members including an electrically insulative material having a first dielectric strength and a first thermal conductivity;

receiving, by each of a plurality of optical repeaters coupled to the internal surface of at least one of the plurality of thermally conductive ceramic members;

generating, by each of the plurality of optical repeaters, an optical output signal;

communicating the optical output signal to an optical fiber disposed outside of the interior space formed by the plurality of thermally conductive ceramic members;

conveying thermal energy generated by each of the plurality of optical repeaters through the thermally conductive ceramic member attached to the respective optical repeater and through a thermally conductive material disposed about at least a portion of an exterior perimeter of the hollow structure, the thermally conductive material including at least one material having a second thermal conductivity that is greater than the first thermal conductivity;

conveying the thermal energy transmitted by the thermally conductive member through a housing disposed about at least a portion of the thermally conductive material, the housing including a material having a third thermal conductivity that is greater than the first thermal conductivity; and maintaining the thermally conductive material and housing at a relatively low second voltage.

26. The method of claim 25 wherein applying the relatively high first voltage to the conductive member disposed at least partially in the interior volume of the hollow structure formed by the plurality of thermally conductive ceramic members comprises:

applying the relatively high first voltage to the conductive member disposed at least partially in the interior volume of a hollow structure formed by a plurality of planar, thermally conductive, ceramic members.

27. The method of claim 26 wherein applying the relatively high first voltage to the conductive member disposed at least partially in the interior volume of the hollow structure formed by the plurality of planar, thermally conductive, ceramic members comprises:

applying the relatively high first voltage to the conductive member disposed at least partially in the interior volume of a hollow polygonal structure formed by the plurality of planar, thermally conductive, ceramic members.

28. The method of claim 25 wherein applying the relatively high first voltage to the conductive member disposed at least partially in the interior volume of a hollow polygonal structure formed by the plurality of planar, thermally conductive, ceramic members comprises:

applying the relatively high first voltage to the conductive member disposed at least partially in the interior volume of a hollow triangular structure formed by three planar, thermally conductive, ceramic members.

\* \* \* \* \*